United States Patent

Miyano et al.

[11] Patent Number: 5,811,877
[45] Date of Patent: Sep. 22, 1998

[54] SEMICONDUCTOR DEVICE STRUCTURE

[75] Inventors: Ichiro Miyano, Fujisawa; Ikuo Kawaguchi, Tokyo; Kunio Matsumoto; Junichi Saeki, both of Yokohama; Tooru Yoshida, Yamato; Naoya Kanda, Yokosuka; Isamu Yoshida, Yokohama; Michifumi Kawai, Tokyo; Hideo Yamakura, Yokohama; Shigeharu Tsunoda, Fujisawa; Ritsuro Orihashi, Yokohama; Masachika Masuda, Tokorozawa; Sueo Kawai, Ibaraki-ken, all of Japan

[73] Assignee: Hitachi, Ltd., Tokyo, Japan

[21] Appl. No.: 829,144

[22] Filed: Mar. 31, 1997

Related U.S. Application Data

[63] Continuation of Ser. No. 521,221, Aug. 30, 1995, abandoned.

[30] Foreign Application Priority Data

Aug. 30, 1994  [JP]  Japan ................................. 6-204852
Sep. 2, 1994   [JP]  Japan ................................. 6-209552

[51] Int. Cl.⁶ .............................. H01L 23/48; H01L 25/18
[52] U.S. Cl. ...................... 257/706; 257/717; 257/720; 257/723; 257/686; 257/669; 257/685
[58] Field of Search ................................. 257/706, 707, 257/675, 669, 717, 719, 720, 721, 722, 723, 696, 689, 686, 666, 685, 693, 692

[56] References Cited

U.S. PATENT DOCUMENTS

| | | | |
|---|---|---|---|
| 4,620,215 | 10/1986 | Lee | 257/735 |
| 5,068,712 | 11/1991 | Murakami et al. | 257/686 |
| 5,157,478 | 10/1992 | Ueda et al. | 257/712 |
| 5,299,092 | 3/1994 | Yaguchi et al. | 257/686 |
| 5,394,010 | 2/1995 | Tazawa et al. | 257/686 |
| 5,554,886 | 9/1996 | Song | 257/686 |

FOREIGN PATENT DOCUMENTS

| | | | |
|---|---|---|---|
| A-61-32066 | 2/1986 | Japan . | |
| 0166147 | 7/1986 | Japan | 257/666 |
| 63-169749 | 7/1988 | Japan | 257/737 |
| 3-125440 | 5/1991 | Japan | 257/675 |
| 4-11758 | 1/1992 | Japan | 257/707 |
| 6-29429 | 2/1994 | Japan | 257/696 |

*Primary Examiner*—Tom Thomas
*Assistant Examiner*—Alexander Oscar Williams
*Attorney, Agent, or Firm*—Antonelli, Terry, Stout & Kraus, LLP

[57] ABSTRACT

An ultra-thin resin molded semiconductor device of high reliability with low cost and with easy repair at time of mounting. A plurality of these semiconductor devices are stacked to provide a semiconductor module which has a higher function than semiconductor devices in the same volume, and a card type module utilizing assembled by the stacked semiconductor module is provided. In manufacturing the semiconductor module, an extremely thin lead frame and an LSI chip are directly connected together, and the mirror surface of the LSI chip is exposed by using a low viscosity epoxy resin to have a thin molding. The mirror surface is grinded to have a further thin thickness of the whole structure of the semiconductor device. A part of the lead frame is formed as a reinforcing member, a heat radiation path, a light shielding part for shielding the LSI from harmful light beams, or a positioning base for mounting a substrate. The above ultra-thin resin molded semiconductor devices are interconnected together in a stacked layout to provide a stacked semiconductor module, and to provide a card type device having a higher function.

26 Claims, 15 Drawing Sheets

PROCESSED SURFACE

PROCESS OF THE PRIOR-ART TECHNIQUE

PROCESS OF THE PRESENT INVENTION

SEMICONDUCTOR DEVICE STRUCTURE

This application is a application of Ser. No. 08/521,221, filed Aug. 30, 1995 now abandoned.

BACKGROUND OF THE INVENTION

The present invention relates to a memory device which is used in a personal computer or a workstation and a memory card which is adopted as an option device of these machines and a work, and more particularly to a structure and a manufacturing method of an extremely compact and high performance semiconductor devices which will also be used as a memory device of high speed operating and editing compact multi-media package having a mutual communication function and a memory device of an image pick-up package having various digital processing functions.

In order to form leads of an LSI package for a resin mold type semiconductor device in the market, a lead frame of a relatively low manufacturing cost is used. Depending on the position of a lead frame and an LSI chip, the semiconductor package is classified into two types: one is LOC (Lead on Chip) type package in which the lead frame is positioned on the upper surface of the LSI chip, as described in JP-A-61-32066 and the other is a COL (Chip on Lead) type package in which the lead frame is positioned on the lower surface of the LSI chip. Particularly, in the latter case structure of the COL type package, it is necessary to process a part of the lead frame at a portion called a die pad for bonding the LSI chip with the lead frame to fix the lead frame with the LSI. In both structures, a wire bonding method is used for compressing an Au wire of about 25 μm with an ultrasonic wave and heat for an electrical connection of the lead frame with the electrode on the LSI. In order to secure the reliability of a temperature cycle testing and the like, an external size which takes into account a wire loop height of at least 110 μm is necessary.

Particularly, in the case of the COL type package, it is difficult to reduce the package thickness under 0.45 mm because of the thickness of the lead frame and the die pad.

In the mean time, as a structure which aims at only a thin type semiconductor package, a tape carrier type package is available, a tape carrier is provided by laminating a copper foil of about 35 μm on a polyimide tape and by etching this copper foil to form an electrode pattern, and this tape carrier is thermocompressingly bonded with a plated metal an electrode on the tape carrier and with a gold bump formed on the electrode of the LSI chip. However, the manufacturing cost of the tape carrier type package tends to be higher because of a difficulty in standardizing the tape carrier itself and a lot of chemical and mechanical processes are required. In this structure the electrode portion which supports the LSI chip is easy to be deformed. Therefore, in the process of resin molding, the LSI chip is unstable inside the mold due to the resin inflow pressure and the polyimide tape is thermally deformed. In order to position the LSI chip and prevent the thermal deformation of the polyimide tape a support member should be attached as described in JP-A-5-315384. Although, the thickness of the support member is added it is possible to reduce the thickness than the package in which the wire bonding method is used. However, there has been limit to the thinning of the package.

The tape carrier type package has a problem of variation in the forming of the electrodes because of insufficient mechanical strength of the external electrode which made of thin copper form. It causes positional mismatch which is between the tape carrier leads and the foil pattern on a substrate at the time of mounting, and thus the mounting work is difficult. Further, the lead material such as copper foil is easy to solve and make alloys such solder. As a result, it makes difficult to repair the package after soldering.

In the case of a specific type of semiconductor, a malfunction occurs when a light beam such as ultraviolet rays are irradiated to the surface of the LSI. To obtain a thinner semiconductor package, the resin thickness of the outer periphery of the semiconductor chip is also designed thinner. However, no thin-type semiconductor device has yet been invented which positively takes account of shielding the LSI chip from harmful light beams.

In order to achieve a large memory capacity which is comparable with a magnetic disk, a CD-ROM and a magnetic tape by a memory LSI such as a RAM, a ROM and a flash memory, a stacked module of plural memory LSI is provided by connecting electrodes of each package that have the same functions. Various types of stacked memory LSI module have been designed. When a TSOP package having a thickness of 1 mm, which is a prevailing thin type package that uses the lead frame and the wire bonding method, is set as a unit of stacking, not only the thickness of a single package but also the whole structure of the stacked module becomes thick and it is not possible to mount this module on a limited space such as a memory card or the like as described in JP-A-3-96266, for example. In case a stacked structure unit is replaced by the tape carrier package, there is a limitation to the number of packages because of an insufficient strength of the lead. Further, if a defective package is mixed into a unit of the stacked module, a repair work for removing the defective package and replacing that package with a good package is very hard.

As described above, the prior art techniques have both advantages and disadvantages and no semiconductor package has been provided yet which simultaneously satisfies the thinning, easy handling at the time of processing and mounting, prevention of harmful light beams, effective heat radiation, securing of mechanical strength, etc.

SUMMARY OF THE INVENTION

It is therefore an object of the present invention to reduce the cost of super thinning a semiconductor package which it has so far been impossible to achieve due to the constraints of a wire loop height and a resin thickness in a structure that uses a wire bonding, and to provide a semiconductor package which improves the mounting efficiency of the semiconductor package per unit area as a stacked structure.

It is another object of the present invention to provide a method for manufacturing a semiconductor package which reinforces the whole of an LSI chip and a package, restricts the deformation due to a compression of the mold resin, and the warping due to the shrinkage of the mold resin improves repair capability, and improves moldability in the resin molding, without an increase in the number of process and without cost increase.

It is still another object of the present invention to provide a semiconductor packages which is structured to prevent a malfunction of an LSI chip by efficiently radiating heat from the LSI chip in the stacked module and by shielding the LSI surface from harmful light beams.

In order to achieve the above objects, according to one aspect of the present invention, an electrode is formed to have an extremely thin thickness by rolling and having a uniform thickness which is prepared to have sufficient strength for a repair work the metal lead frame is metallurgically directly connected with the electrode on the LSI.

Then, this connected unit is resin molded in the state that the LSI mirror surface on which a circuit pattern is not formed is exposed, and the LSI mirror surface side is grinded to form a semiconductor package having a thickness under 250 μm. According to another aspect of the present invention, the LSI chip mirror surface is further grinded in the same manner as described above, and then this grinded surface is polished or chemically etched by using an alkaline solution to thereby remove strain caused by the grinding on the LSI mirror surface. This can further improve the reliability of the package.

According to still another aspect of the present invention, a lead frame of a relatively low cost is used to reduce the cost, and at the same time, a reinforcing member, heat radiation path, a light shield of an LSI pattern and a positioning member are specifically provided, in order to prevent cracking of the LSI chip and warping of the package due to the thinning.

It becomes possible to provide an extremely thin semiconductor package at a lower cost than that with a tape carrier, which it has not been possible to achieve in the structure according to the wire bonding method.

When a lead frame is formed by using a type of metal plate having a thickness which can not be used when a tape carrier is used, a sufficient strength can be obtained at the electrode and repairability of the package on the substrate and at the time of stacking can be improved. Further, a batch inspection of both single package and stacked module using a plag socket is facilitated. Further, the LSI chip can be held at a designed position inside the mold at the time of resin molding, and this assists the thinning design of the resin.

By the reinforcing member of the lead frame, it becomes possible to stabilize the grinding processing using a diamond grinding wheel to thin a semiconductor package from the back surface of the LSI chip after a resin molding, and further according to the polishing using free abrasive and an polishing pad. Therefore, it is possible to achieve an extreme thinning of the package and the LSI chip contained in the package, with the handling of the LSI chip and the wafer in the intermediate process left as in the conventional manner.

Since the mirror surface of the LSI chip is exposed, it becomes possible to radiate the heat with high efficiency.

Since the semiconductor package as a single unit can be made extremely thin, it becomes possible to mount a large number of semiconductor package on a limited mounting area with a limited height such as a memory card, for example, by having a layout of the stacked semiconductor package. This can achieve a high functional package per unit area and per unit volume.

BRIEF DESCRIPTION OF THE DRAWINGS

FIG. 1A is a top view of a single layer structure, FIG. 1B is a cross sectional view of the single layer, and FIG. 1C is a sectional view of a stacked structure.

FIG. 4A is a plan view of a lead frame before disconnecting and FIG. 4B is a plan view of the lead frame in the state that the lead frame has been disconnected after the chip has been connected.

FIG. 5A is a side view of the positioning and FIG. 5B is a perspective view (an extract of the main element) of the positioning.

FIG. 10A shows a pattern (1) of a chip selection, FIG. 10B shows a pattern (2) of a chip selection, and FIG. 10C is a pattern (3) of a chip selection.

FIG. 11A shows a pattern (1) of a chip select lead, FIG. 11B shows a disconnecting pattern (2) of a chip select lead, and FIG. 11C is a pattern (3) of a chip select lead.

FIG. 14A shows an example of the mounting of a stacked memory module according to the present invention and FIG. 14B shows an example of the mounting of a conventional type stacked memory module with tape carrier type packages.

DETAILED DESCRIPTION OF THE PREFERRED EMBODIMENTS

Figure 1A:
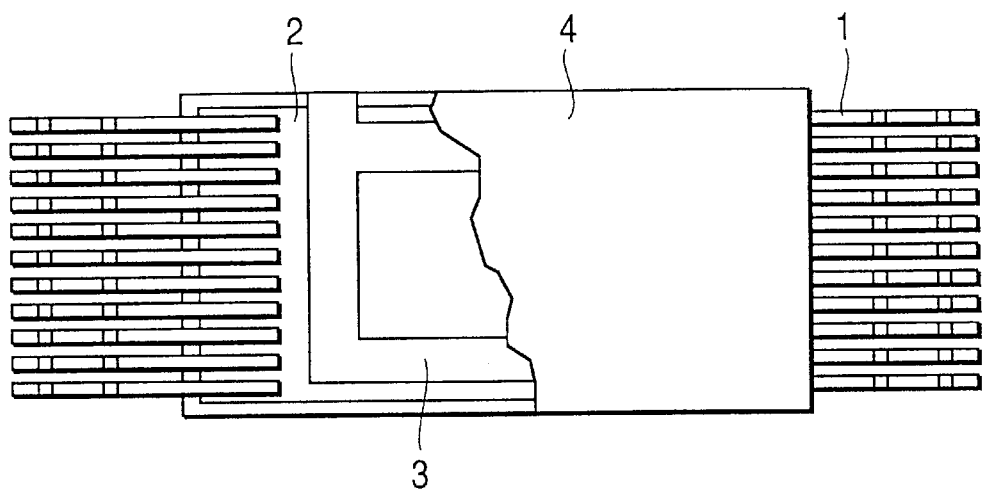
FIGS. 1A to 1C are views showing a basic structure of a semiconductor device of the present invention, where

Embodiments of the present invention will be explained below with reference to the attached drawings. In the figures, the same reference numerals and symbols represent like elements or parts.

EMBODIMENT 1

A structure and a manufacturing process of a extremely thin package which is the basis of the present invention will be explained below with reference to FIGS. 1 to 8.

Figure 1B:
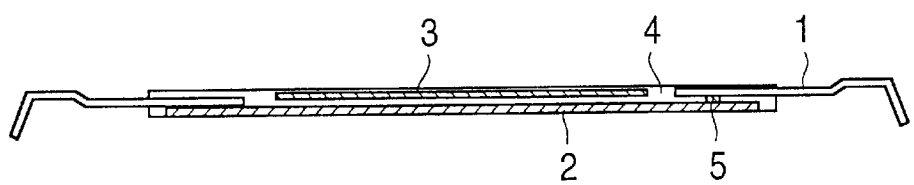
Figure 1C:
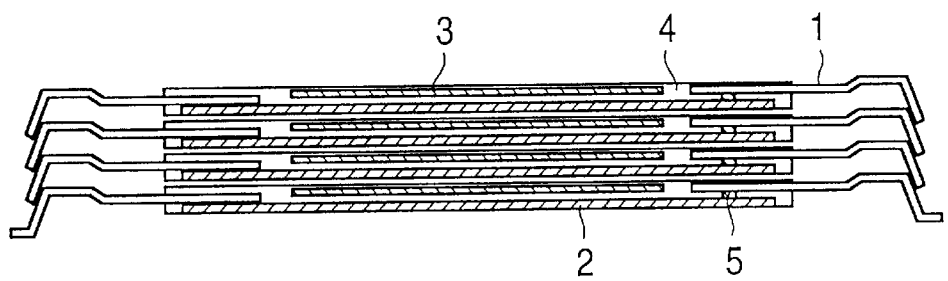

FIGS. 1A to 1C show structural elements of a thin type semiconductor package having a thickness under 250 μm. This semiconductor package includes an extremely thin metal lead frame 1, an LSI chip 2 which is metallurgically directly connected to the metal lead frame to form an electrode, and a part of the lead frame which is used to achieve mainly a thinning by a grinding from the exposed surface side after resin molding, and a reinforcement of the LSI chip 2. A reference numeral 3 represents an LSI chip reinforcing portion and 5 represents a solder bump.

A strip made of a Fe-Ni group alloy, for example, under 50 μm is patterned by etching or the like, and this is used for the lead frame 1. If the mismatch of the thermal expansion of a lead frame material should not take into account and when a adequate mechanical strength can be obtained, a Cu alloy can also be used as the lead frame.

Figure 2:
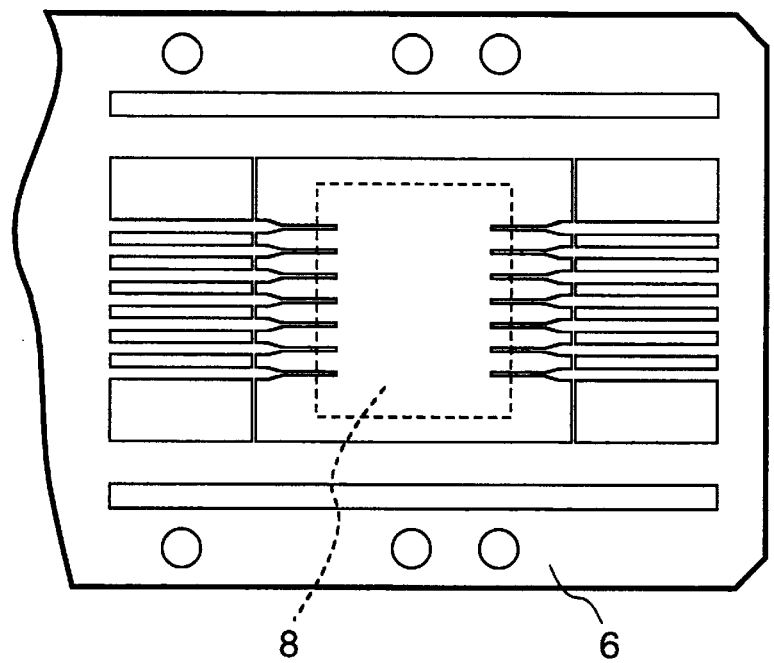
FIG. 2 shows a conventional type lead frame etching pattern.
Figure 3:
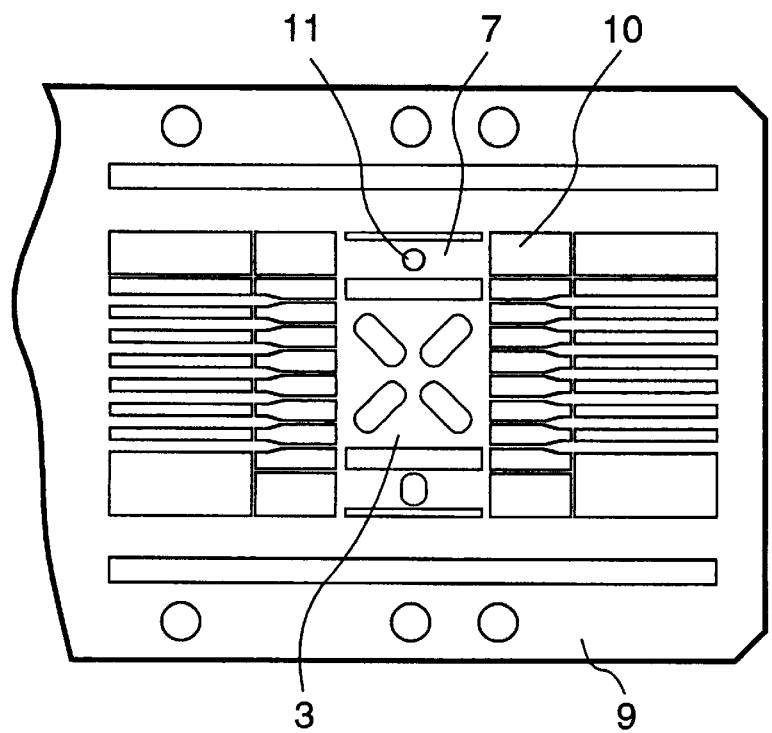
FIG. 3 shows an etching pattern of a lead frame which is effective in the structure of the present invention.
Figure 4A:
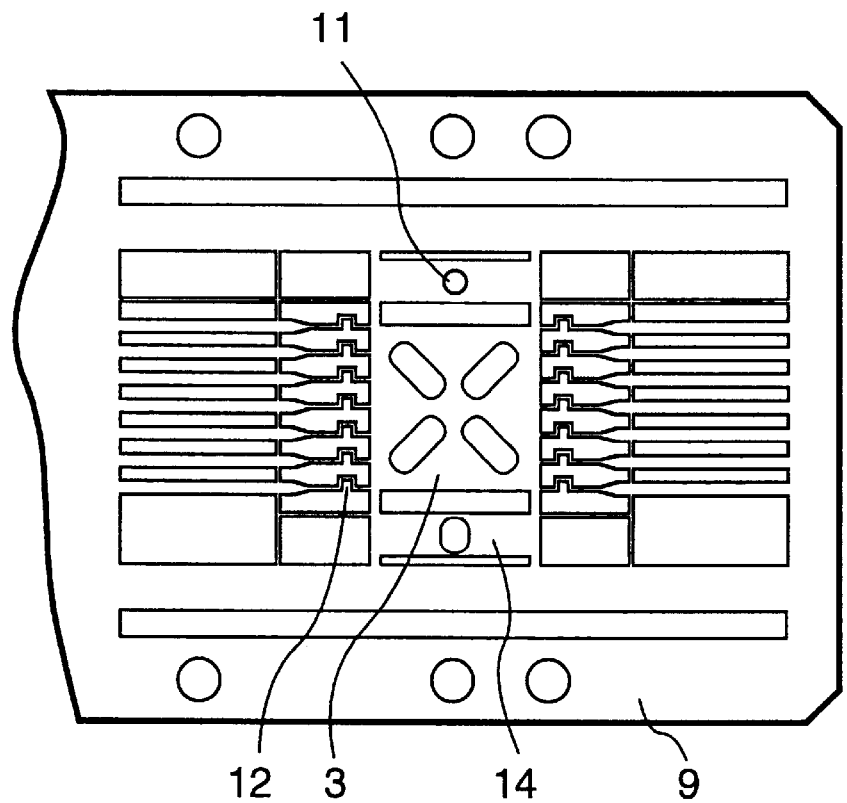
FIGS. 4A and 4B show the patterns of a thermal stress release type inner lead, where
Figure 4B:
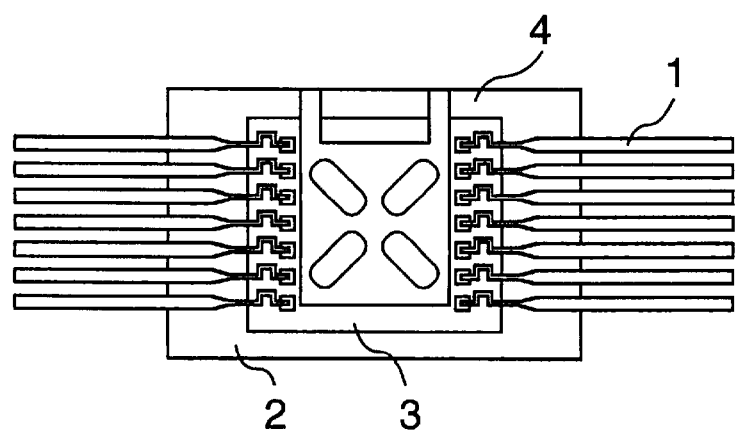

In such an extremely thin lead frame 1 as described above, electrode pattern to be connected with the LSI chip 2 is fined to match the size of the electrode on the LSI chip 2. Accordingly, when this electrode is supported by only a tie-bar to prevent a leakage of resin at the resin molding, in the shape which is used for the lead frame of a normal thickness as shown in FIG. 2, there is a high risk of an occurrence of a deformation of the fine pattern by over etching in the etching process or a flow pressure of a plating solution in the plating process. A reference number 6 represents a conventional lead frame pattern and 8 represents an LSI chip bonding position. In order to prevent fine pattern deformation, a reinforcing member 3 for the processing of the lead frame is formed near the position of the fine pattern as shown in FIG. 3 which shows a lead frame having a lead frame pattern 9 according to the present invention. The etching and plating are processed in this shape. Then, a predetermined position is separated and electrically isolated before the connection with the LSI. A reference number 7 represents a processing part for a positioning hole, 10 a separate position and 11 a positioning hole. When this method is used, a processing of finer leads is performed, particularly the number of electrodes on the LSI chip has been increased. The disconnection between the lead frame 1 and LSI due to a thermal expansion of the lead frame has occurred, a curved stress releasing pattern 12 is provided as shown in FIGS. 4A and 4B in stead of a linear pattern. A reference number 14 represents a portion for a positioning hole. It is also possible to form a lead frame by punching process with die and punch, in addition to the etching.

For the connection between the lead frame 1 which has been found in the manner as described above and an electrode on the LSI chip 2, a metal diffusing connection is performed by thermal compression between an Au bump formed on the electrode on the LSI and the Au plating or Ag plating which has been provided to the lead frame, for example. It is also possible to connect the lead frame and the LSI chip by bump on the lead frame instead of on the LSI chip 2.

Figure 5A:
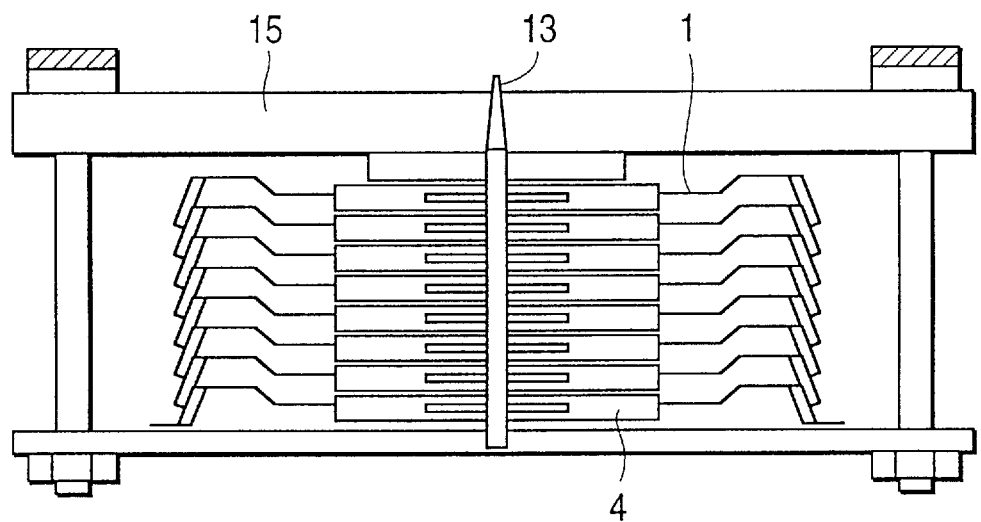
FIGS. 5A and 5B are views showing a basic method of positioning with the hole on the bad frame and the pin on the jig, where
Figure 5B:
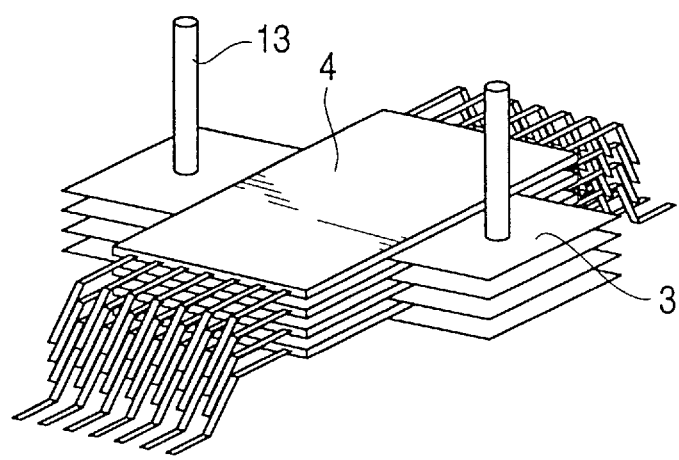

The reinforcing member 3 for processing leads and the lead for the connection with the LSI chip is not separated by the whole portion but a part of the reinforcing member 3 is left at a position superimposed with the LSI chip 2, isolated with an electrical connection between the lead frame 1 and the LSI chip 2. This remained member is used as the reinforcing member 3 for the LSI chip, and this prevents a warp or a crack of the LSI chip at the time of the thinning of the LSI chip and the whole semiconductor package. If the reinforcing member 3 of the LSI chip 2 is exposed to the outside of the mold resin 4 as shown in FIG. 5B, the reinforcing member 3 serves as the heat spreader or radiator fin for radiation 4 by designing the shape of the reinforcing member. It is also possible to form a positioning hole 13 according to a pin and hole method in the mounting process as shown in FIGS. 5A and 5B. A reference number 15 represents a jig. It is also possible to use the LSI chip reinforcing portion as a portion for shielding a pattern forming surface on the LSI chip from harmful light beams which cause malfunction of the LSI chip.

Figure 6:
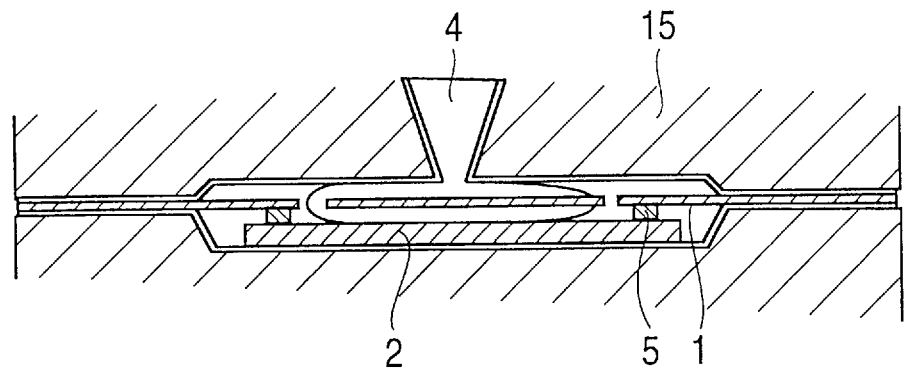
FIG. 6 is a cross section of the resin molding.

After the lead frame 1 and the LSI chip 2 have been connected, the outside of the lead frame and LSI is molded by resin. In this case, molding is carried out in the state that the back surface on which the circuit of the LSI chip 2 is not patterned, or the mirror surface side, is pressed against the mold 15, as shown in FIG. 6, and the mirror surface side is exposed after the molding. Since the hardness of the lead frame 1 is relatively higher than that of the copper foil having the thickness of 35 μm in the tape carrier type semiconductor, the displacement of the LSI chip inside the mold that is generated by the resin inflow pressure is restricted by a level sufficiently enough for designing the thinning of the resin.

For the inflow of the mold resin 4, the resin is flown into the mold from the top where the lead frame 1 of the semiconductor package exists (the pattern forming side), not by the normal side flow. It is desirable to use a top-down flow as shown in FIG. 6. When this method is used, the displacement of the LSI chip can be further restricted. If a low-viscosity resin of about one hundredth of the normal resin viscosity is used for the resin molding work, the thickness of the resin portion can be designed to be thin.

Figure 7A:
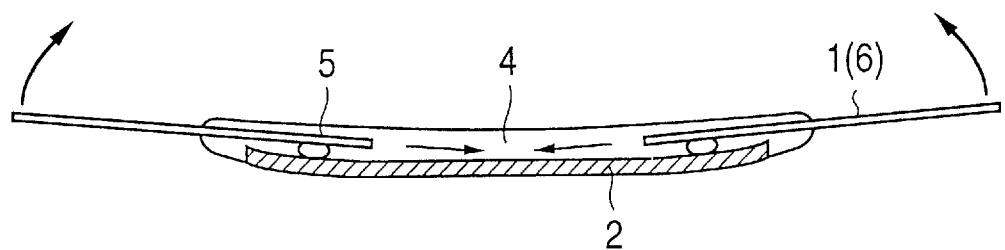
FIGS. 7A and 7B are schematic views showing a state of warp of the semiconductor package according to the prior art technique and the present invention respectively.
Figure 7B:
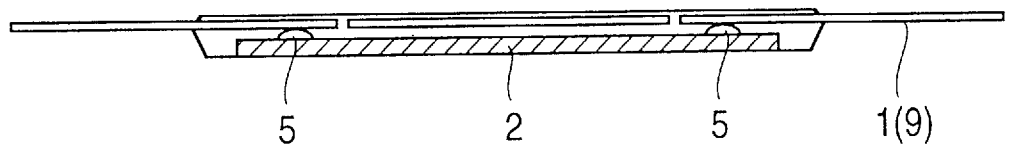

When the normal resin mold encapsulation is performed for only one side of the LSI chip 2, a warp as shown in FIG. 7A occurs in the whole semiconductor package due to a hardening shrinkage of the resin or due to a mismatch of thermal expansion coefficients between the epoxy resin which is a resin material and silicon which is an LSI chip material, which may result in a crack of the LSI chip depending on the situation. Particularly, this becomes a problem when the semiconductor package is to be thinned. According to the present invention, however, since a part of the lead frame 1 (9) is formed as a reinforcing portion 3A as shown in FIG. 7B, it is possible to prevent an occurrence of a deformation of the lead frame. This reinforcement also becomes effective when a large-size LSI chip has been mounted. Since the reinforcing material is built into the resin mold material 4, it is not necessary to attach a reinforcing plate from the outside at a later stage, and thus this built-in structure becomes advantageous for the thinning and the rear side grinding process.

Figure 8A:
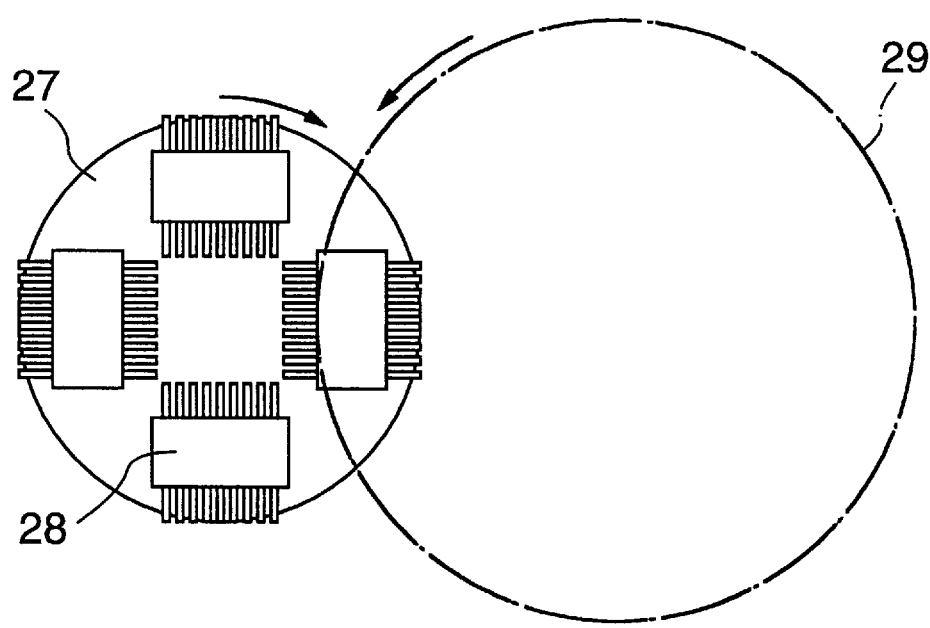
FIGS. 8A and 8B are a top plan view and a cross section respectively of a processing state for explaining the method of thinning according to a grinding.
Figure 8B:
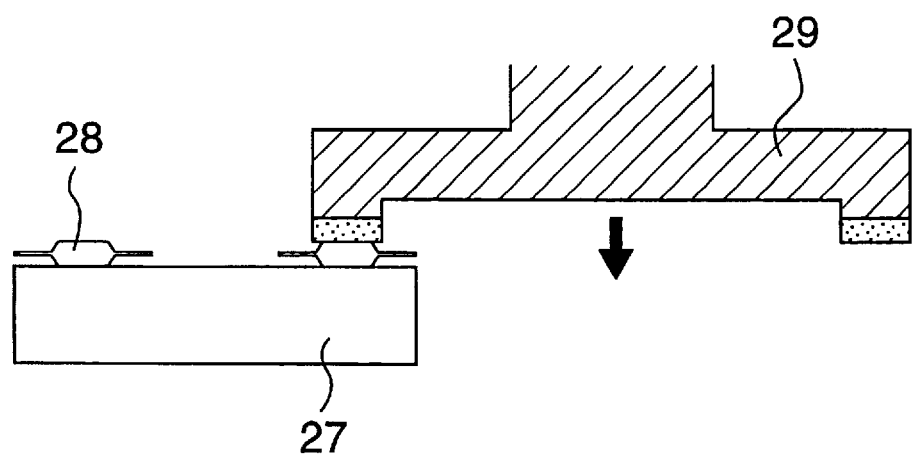

After the process up to the above-described molding process has been finished, the thickness of the semiconductor package becomes about 450 μm. This is prescribed by a minimum value of the thickness of the lead frame 1 (9), the height of the connecting part between the lead frame and the LSI chip, the thickness of the LSI chip and the moldable resin thickness. When the current silicon wafer is processed to have a thickness under 250 μm, a failure rate due to a crack damage or the like increases extremely in the wafer carrying process and the dicing process. Further, according to the current grinding, a maximum warp of the wafer itself may reach a 1~2 mm, which makes it impossible to dice the wafer into LSI chips and to connect with the lead frame in the wire bonding method or the like. Accordingly, a practically permissible thinning limit of the wafer is considered to be around 200 μm. In order to form a ultra-thin type semiconductor package of the thickness under 250 μm, the above aspect should be taken into account and, after the process up to the resin molding has been finished, the grinding processing is carried out from the mirror surface side of the LSI chip or from the LSI chip exposed surface side, to thin the whole structure, instead of using an LSI chip which has been grinded to be thin at the wafer state. In FIGS. 8A and 8B, a reference number 27 represents a work holder, 28 a resin-mold semiconductor package such as, for example, a memory after packaging and 29 a grinding wheel. In this method, it is also possible to set the thickness of the LSI chip 2 to 50 μm or below. In this process, the reinforcing portion structured by a part of the lead frame 1 becomes effective in preventing a crack of the LSI chip or a warp of the semiconductor package.

In the grinding processing, an occurrence of such phenomena as a destruction of the LSI chip by a force generated at the time of the processing, a peel off of the resin from the LSI chip and a destruction of the LSI chip by an external force such as a thermal impact because of a rough surface of the LSI chip after the processing, is expected. Therefore, grinding conditions and a grinding method which do not generate the above phenomena are selected.

A method of grinding from the back surface of the LSI chip will be explained below. For the grinding, a plane surface grinding using a cup type diamond grinding wheel is used. This method makes it possible to restrict the coarseness of the surface to a better degree than the method using a disk type grinding wheel. When an in-feed grinding method is used, the surface coarseness can be further reduced.

At the grinding process, several to dozens of semiconductors are fixed to the work holder. The circuit forming surface on the LSI chip is at the work holder side and the mirror surface side on which the circuit is not formed is a surface to be processed. The following grinding conditions were set.

a processing machine: a plane surface grinding machine (GHR-SF, a product of Hitachi Seiko Co., Ltd.)
a grinding wheel: a cup type metal bond diamond grinding wheel (SDI500P75M)
rotation speed of the grinding wheel: 5,000 rotations/minute
rotation speed of working axis: 300 rotations/minute
cross feed speed: 50 μm/minute
cross feed volume: 0.3, 0.4, 0.5, 0.55 mm After a grinding process has been carried out by the LSI chip incorporated inside the semiconductor package reaches a thickness of 0.05 mm, there was no cracking of the LSI chip or a delamination of the resin has occurred. The coarseness of the surface was 0.08 μm Rmax and it was possible to finish in the state near a mirror surface. After the above processing, a temperature cycle test (−55° C. to 150° C.) was carried out as a reliability test, and there was a crack of the LSI chip or a peel off of the resin has been observed.

The following limitation is considered for the thinning of a semiconductor package by the above grinding process. As a wiring layer of the surface of the LSI chip, a total thickness of the activation layer and the wiring layer is about 0.006 mm and it is necessary to secure a thickness larger than this. In order to prevent a malfunctioning of the incorporated LSI chip by harmful light beams such as ultraviolet rays or the like, the resin portion requires a thickness of at least about 0.1 mm. The total thickness becomes about 0.11 mm. Accordingly, if a mechanical strength of the LSI chip can be secured by the reinforcement structure of the lead frame portion, it is possible to set the thickness of the semiconductor package to as close as possible to the above thickness and to reduce the thickness of the mold resin.

As described above, it is possible to secure a status which can sufficiently satisfy the reliability evaluation by a temperature cycle test or the like with only the surface to which the above-described grinding process has been performed. However, it is extremely difficult to completely prevent an occurrence of a distortion or a micro crack on the processed surface. In order to further eliminate the possibility of the occurrence of such a risk and to further improve the reliability, a polishing and a wet etching are added to the processed surface after the grinding processing as described below.

A polishing will be explained at first.

FIG. 15 shows a conceptual diagram of the polishing. In the polishing, an abrasive cloth is bonded to the grinding machine and an abrasive solution is supplied into the abrasive cloth. This abrasive cloth is pressed against an object to be processed and the grinding machine is rotated. By this operation, the abrasive cloth and the surface to be processed are sided together in the state that abrasive particles exist in the space therebetween, so that the surface of the processed object is finely removed and the processing is progressed.

The following conditions were set for the polishing.
a processing machine: a single surface polishing machine (SH24, a product of speed fam Co., Ltd.)
an abrasive liquid: colloidal silica (GLANZOX3900, a product of FUJIMI Co., Ltd.)
rotation speed of the abrasive machine: 100 rotations/minute
rotation speed of the working axis: 100 rotations/minute
abrasive pressure: 20 kPa
abrasive cloth: nonwoven fabric (suba400, a product of Rodel Nitta)

In about 10 minute processing, the processed surface became a mirror surface state. The surface coarseness in this case was about 0.01 Rmax. There was no occurrence of a delamination of the resin at the interface between the resin and the LSI chip or a crack in the LSI chip.

Wet etching will be explained next.

The grinding surface of the LSI chip is set as the main portion for the wet etching. There are two types of etching solution for the silicon wafer, i.e. an acid solution and an alkaline liquid. For the purpose of preventing corrosion of the lead frame of 42 alloy, an alkaline etching solution was selected, and the wet etching conditions were set as follows.
an etching solution: potassium hydroxide (KOH) solution
etching time: 2 minutes In two minutes of etching, the quantity of etching became 20 μm and the surface coarseness of the LSI chip after the etching was about 1.5 to 2.3 μm Rmax. There occurred no delamination of the resin at the interface between the resin and the LSI chip or a cracking in the LSI chip, as was the case with the polishing.

The above-described polishing and wet etching are just auxiliary process for the grinding, and the polishing and the wet etching are not necessarily required after the grinding. In order to achieve the objects of the present invention, other methods than the above-described thinning processing may also be used.

In thinning the semiconductor package, it is necessary to design a thin thickness for the resin on the side where an LSI chip is patterned, and it is also necessary to prevent a malfunction of the LSI chip due to an irradiation of harmful light beams such as ultraviolet rays or the like. The reinforcing portion of the LSI chip provided by processing a part of the lead frame also works as a light shielding member and therefore, this reinforcing member is valid for preventing a malfunctioning of the package due to lights.

After finishing the process up to the resin molding, semiconductors are cut off from the lead frame and the electrode which is to be connected on the substrate is formed in a predetermined shape and thus an ultra-thin semiconductor is completed.

In the case of mounting a substrate or in the case of stacking of semiconductor packages with other semiconductor packages of the same kind, it is also possible to use a positioning hole provided on the lead frame according to the pin and hole method.

EMBODIMENT 2

A second embodiment of the ultra-thin type semiconductor package according to the present invention will be explained below with reference to FIGS. 9 to 13 for a stacked semiconductor packages which is assembled of at least two semiconductor packages.

Figure 9:
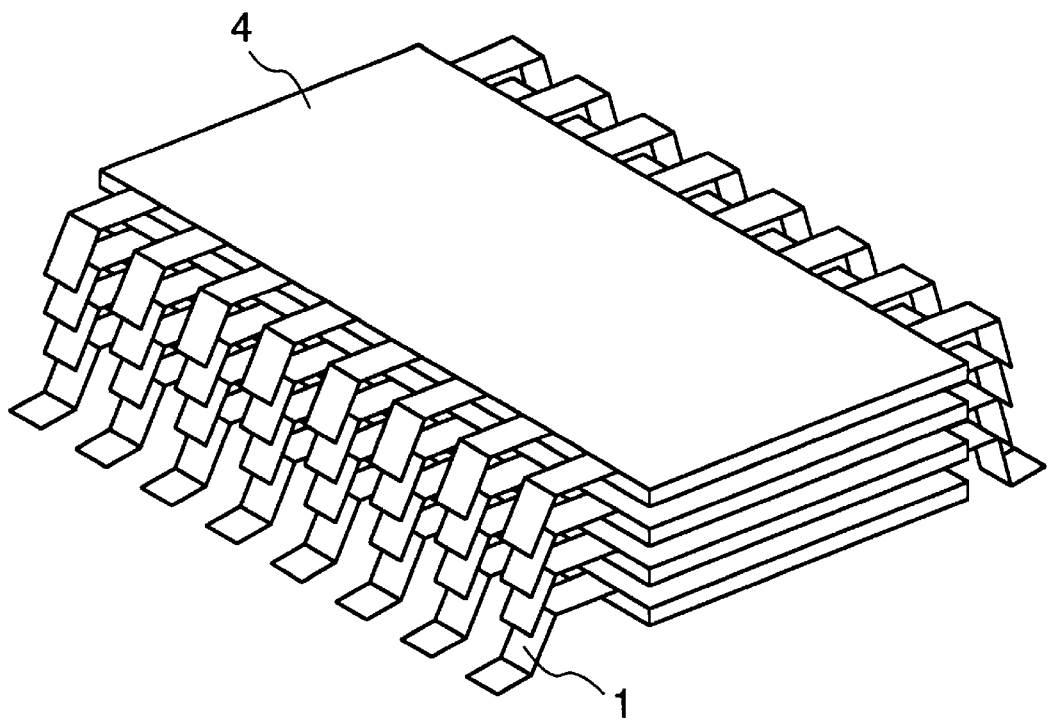
FIG. 9 is a schematic view for showing a state of connecting electrodes of a common function.

When a memory LSI has been contained in the semiconductor package manufactured in the method according to the first embodiment, for example, address electrodes and data input/output (I/O) electrodes which have common functions among the electrodes extracted from each LSI chip are connected in common in the shape as shown in FIG. 9. For other functional electrode which needs to be electrically isolated from each other for each chip, such as, for example, a chip select (CS) electrode, the lead frame shape is changed at the side where the lead frame is connected with the electrode on the LSI chip as shown in different chip select lead patterns (1) to (3) in FIGS. 10A to 10C, and the chip select electrode is disposed on the electrode at different positions. In this case, on each layer of the semiconductor package, an electrode for connecting with the chip select of the semiconductor packages of other layers is provided so as to be electrically independent of the LSI chip, by the number smaller by one than the stacked layer of semiconductor packages. In order to change the shape of the lead frame for the purpose of connecting the chip select electrode, in addition to the method of changing the pattern by etching, another method is considered according to which, for the lead frame of the common shape, a predetermined position at the side near the connection part with the electrode on the LSI chip is cut at the time of manufacturing the lead frame and the separate type is classified at a separate position 19, as shown by connection patterns (1) to (3) in FIGS. 11A to 11C. This method becomes valid when it is desired to adjust the number of productions for an optional layer of stacking, for example.

Even if the shape of the lead frame is different, the outer appearance after the molding is the same for each layer of the semiconductor packages, and thus the operationability up to the mounting such as the forming of the electrode is improved. When it is necessary to classify each semiconductor package, a display mark for identification is provided.

Figure 12:
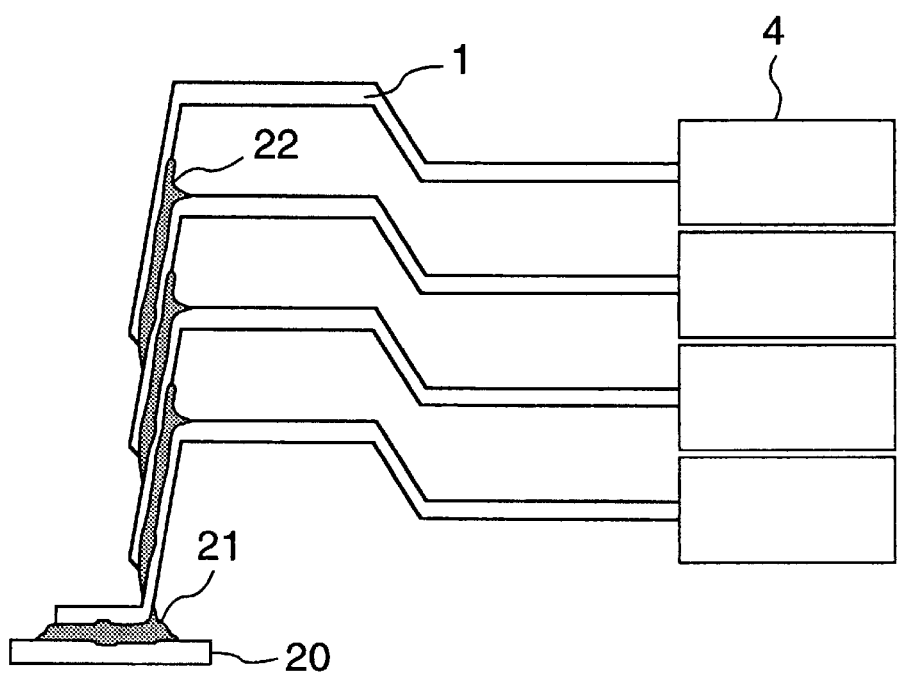
FIG. 12 shows a lead shape (two stage bending) of the semiconductor package according to the present invention.

When a stacked structure is taken, the shape of the electrode is set as shown in FIG. 12, for example. In FIG. 12, 20 represents an electrode on the substrate, 21 a connecting part between the substrate and the semiconductor module, and 22 an inter-layer connecting part. Each lead frame is at first bent at the side near the resin 4, in the direction opposite to the substrate mounted at one end, and the lead frame is provided to have a plane part having a predetermined length and is then bent to the substrate side, thus having two bendings. When this shape is provided, it becomes possible to reduce reflow and thermal stress which occurs at the connection part during the operation time. Further, it is possible to reduce a stress generated at the LSI chip in each thinned layer and at the inter-layer connecting part, which leads to a long life and high reliability of the semiconductor package.

Figure 13:
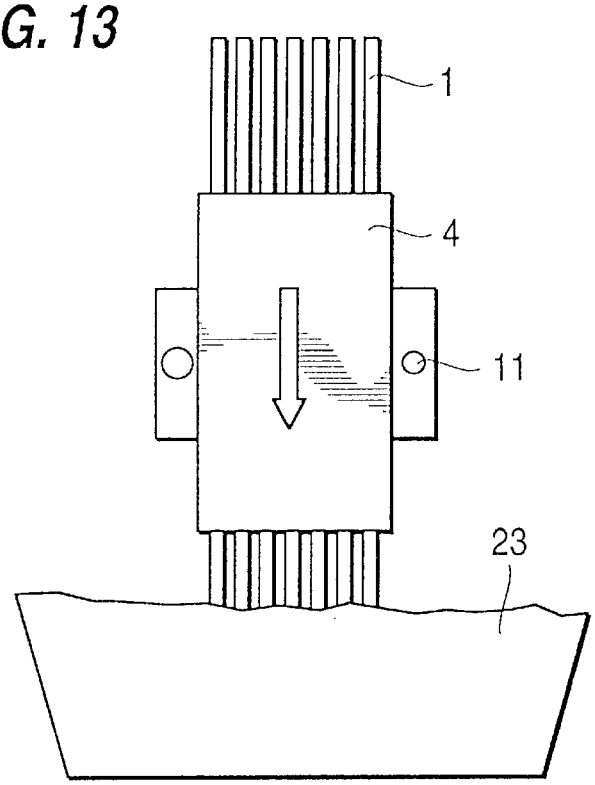
FIG. 13 shows a method of supplying a solder to the lead of the semiconductor package by dipping the lead into a solder bath.

For the stacked connection of semiconductor packages, a positioning hole provided on each lead frame in each layer is used. This facilitates the positioning work of semiconductor packages particularly when the semiconductor packages have a large number of fine electrodes. For the connection of the each layers is stacking process, at first a fixing tool is used to accomplish only an electrical connection. A solder is supplied to the electrode on the lead frame by dipping the lead frame into a solder bath, and the electrodes are positioned and a batch reflow soldering is performed. When a material of Fe-Ni alloy is used for the lead frame, for example, an Ag plating is provided in advance at a position where the lead frame is connected with the electrode on the LSI chip and at a position of an external electrode. After the process up to the molding process has been finished, each semiconductor package is cut out in a predetermined shape and is dipped in a solder bath 23 as shown in FIG. 13. In this case, the solder supply volume can be controlled by an Ag plating range and a dip depth. Since the Ag plating is coated by solder, a part of the Ag plating remains in the solder, so that the solder melting point at the stacked connecting layer can be set in a temperature hierarchy in a direction higher than the melting point at the connecting layer where the substrate is mounted. Accordingly, an inter-layer connection reliability can be improved in the thermal process of mounting the substrate.

In order to set a temperature hierarchy at the stacked connecting layer and the substrate mounted connecting layer, another method can also be considered, such as, for example, a solder of Sn and Pb at the volume ratio of 10 to 90 is used for each inter-layer connection, and a eutectic solder of Sn and Pb at the volume ratio of 60 to 40 is used for the electrode to be mounted on the substrate. When a high-temperature solder is used, the kind of plating to be used on the lead frame may be Sn or the like.

A fact that only one type of plating can be used on the lead frame 1 without differentiating the type of plating at the LSI connection side and at the substrate mounted connection side, and a fact that the manufacturing cost of the lead frame can be reduced because of only type of plating used, are advantages of the method of solder supply by dipping into the solder bath.

After finishing the stacked connection, an electrical inspection of the stacked module is carried out by fitting the stacked module into a predetermined mountable and dismountable test plug socket or by provisionally mounting the stacked module on a test substrate. After confirming the operation of all the semiconductor packages, a predetermined position between the layers is fixed by an ultraviolet rays hardening or thermosetting adhesive agent. When above auxiliary fixing method also is used at the same time, the reliability of the inter-layer electrical connection can be improved.

When an occurrence of a failure has been detected in a part of the semiconductor package by an inspection after the electrical connection of the stacked module, a repair work such as a replacement of the defective package is made possible since an inter-layer connection is carried out by a solder. For example, a wick for absorbing a solder is used to remove the solder at the inter-layer connecting layer and each layer is separated, and the defective package is replaced with a new good part by supplying a solder by a dipping into the solder bath. An electrical connection is carried out again.

When an electrical disconnection failure has occurred due to a small supply volume of a solder, a paste solder is supplied to this portion by an adequate volume and an electrical connection is carried out again.

When semiconductor packages are mounted in a stacked layout, it is considered that a plurality of LSI chips operate inside the stacked module. In this case, it is necessary to take into account the heat radiation from the module because the heating density has become much higher. The ultra-thin semiconductor package according to the present invention has an auxiliary portion mainly for the purpose of protecting the LSI chip. This portion is set in a shape capable of being exposed from the mold resin and is formed as a heat transfer path or a radiation fin to the substrate on which the module is mounted. According to this method, it is possible to promote the heat radiation from the intermediate layer when a large number of semiconductor packages are stacked. Further, it is also possible to attach an auxiliary radiation unit at the chip exposure portion on the mirror surface.

EMBODIMENT 3

An embodiment of a functional card on which an ultra-thin semiconductor package and a stacked module described in the first and second embodiments and other necessary electrical parts are mounted will be explained below with reference to FIG. 14 and FIGS. 16 to 20.

Figure 10A:
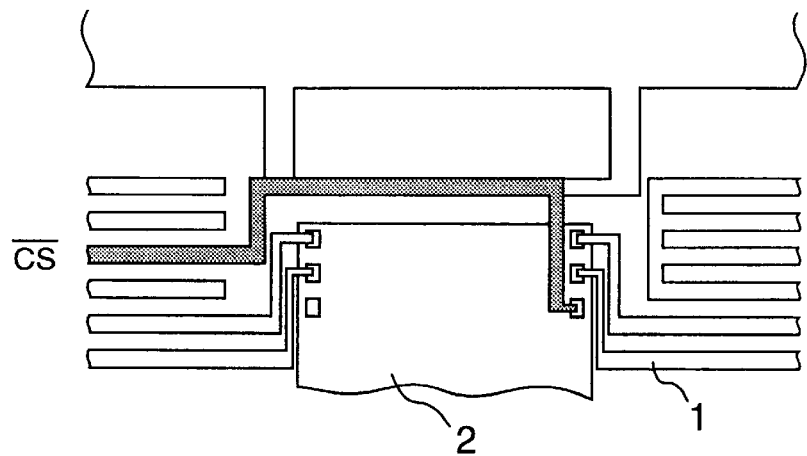
FIGS. 10A to 10C are cross sections explaining a method of changing a pattern of inner lead (a method by etching), where
Figure 10B:
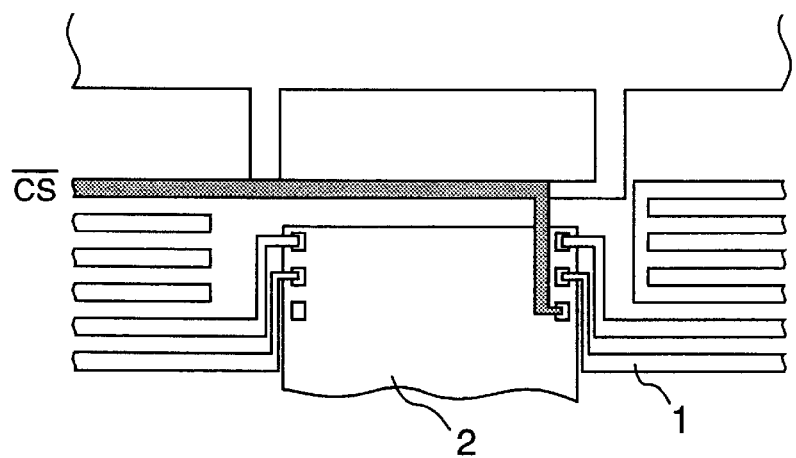
Figure 10C:
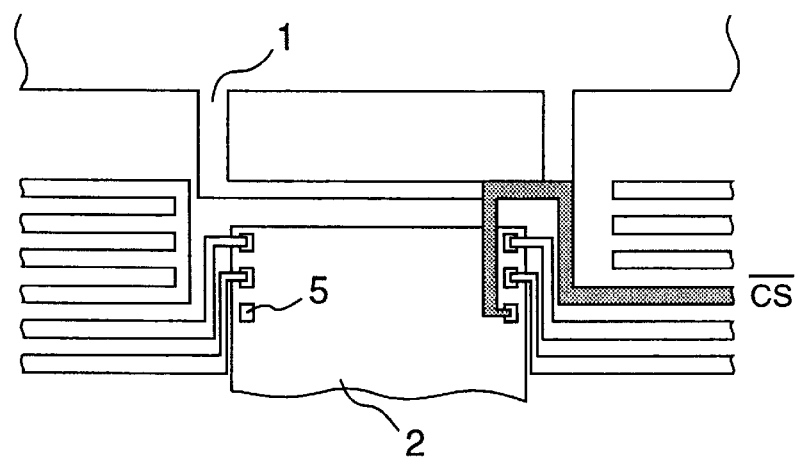
Figure 11A:
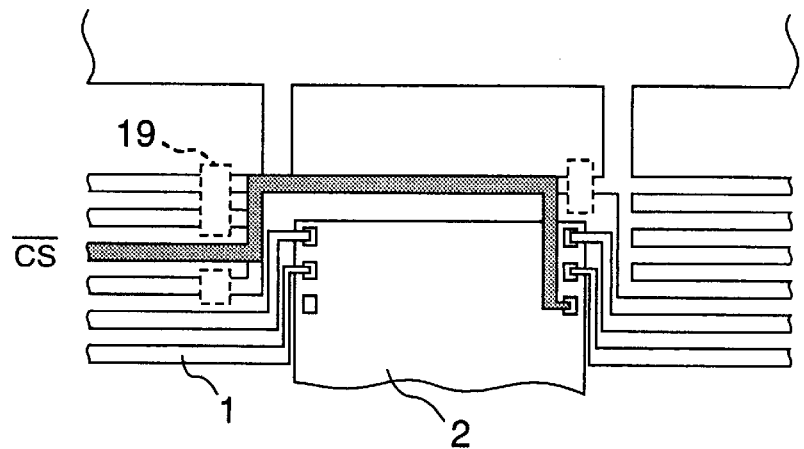
FIGS. 11A to 11C are diagrams for explaining a method of changing a pattern of inner lead (with cutting the part), where
Figure 11B:
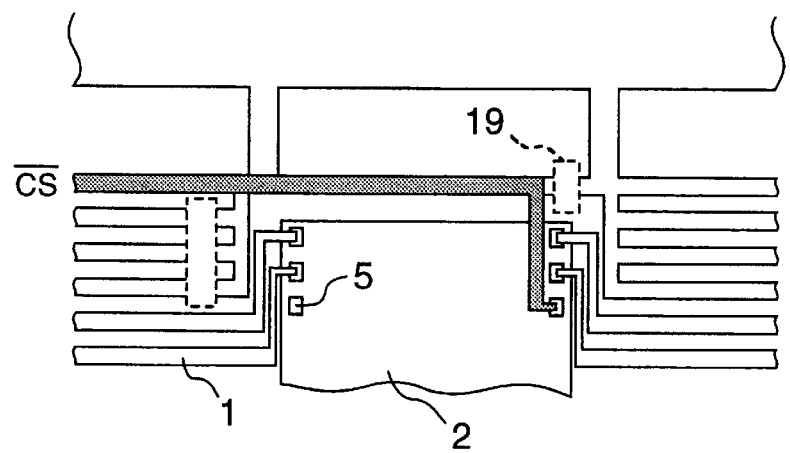
Figure 11C:
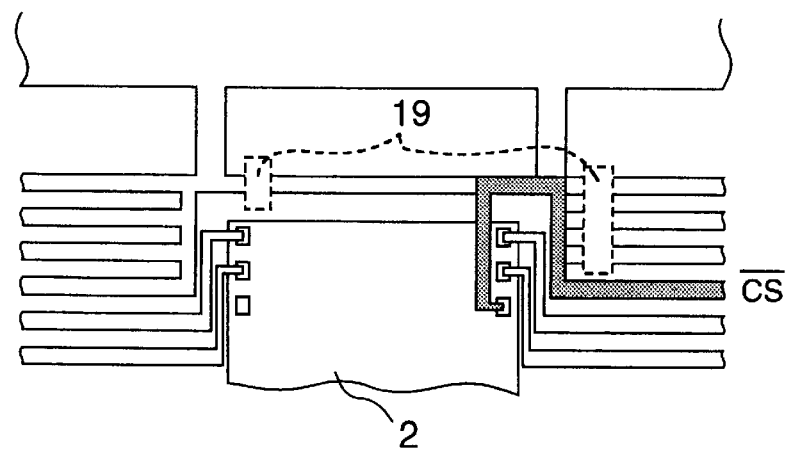

When a memory LSI is incorporated in a functional card according to the standard of PCMCIA, for example, it is necessary to accommodate the memory LSI packages within a thickness of 5 mm as a standard size. When a stacked module of semiconductor packages according to the present invention is used, a total thickness of the stacked structure having eight layers, for example, becomes only about 2 mm since the thickness per one layer is under 0.25 mm. Accordingly, it is possible to mount modules on both surfaces of the a printed circuit board of the thickness about 1 mm. When a normal TSOP type semiconductor package is used, only about two layers can be mounted on one side. Even if tape carrier type semiconductor packages are used, a conventional structure of mounting four layer packages of about 0.6 mm thickness per one layer at the stacking position on one side of the substrate, as shown in FIG. 10B, becomes a practical limit. In FIG. 14B, 25 represents a stacked module according to the tape carrier method, and 26 represents a part such as a memory controlling device. In the case of the tape carrier structure, the mechanical strength of the lead is low and the tape carrier type semiconductors can be stacked only on the substrate, so that it is impossible to handle the stacked module as a single unit. It is also very hard to carry out a repair working the mounting process.

Figure 14A:
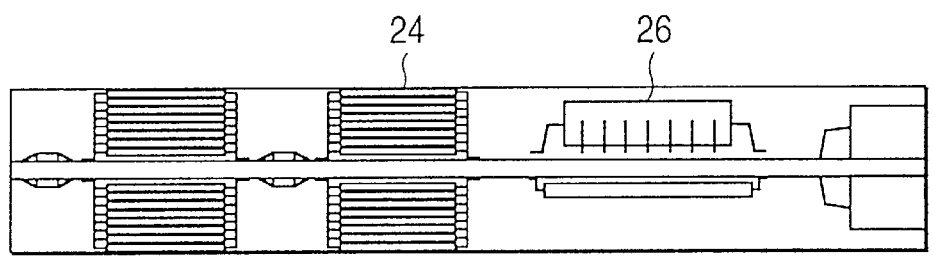
FIGS. 14A and 14B are side views for showing a comparison between the memory card according to the prior-art technique and the memory card according to the present invention respectively, where
Figure 14B:
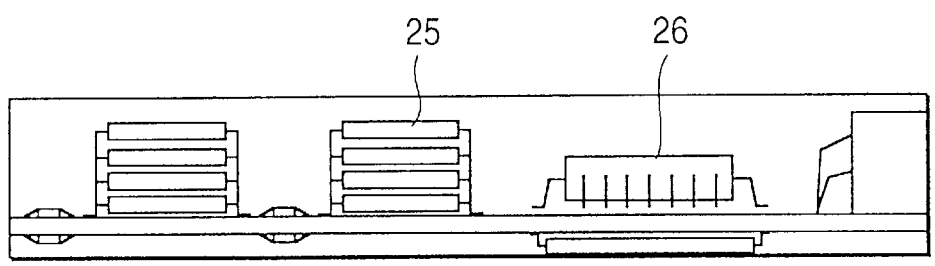

When the semiconductor packages as shown in FIG. 14A is used, it is possible to load four times of the prior-art memory LSIs on the substrate of the same size in the current condition. 24 represents a stacked module which structures a semiconductor devices. Even if a stacked module is not used, it is possible to manufacture an extremely thin card type since a single-layer semiconductor package has a thickness under 0.25 mm.

For a heat radiation from the card type module, a heat transfer method becomes effective. When the reinforced portion of the LSI chip on each semiconductor package is utilized or when an externally mounted heat radiation member is contacted on a metal outer layer which becomes the shell of the card, an efficient radiation can be carried out.

The above embodiment describes the stacked memory. An ultra-thin type memory single unit which has been provided by a grinding process also has an advantage in the mounting. The ultra-thin type memory may also be used without stacking.

An embodiment of a grind-processed ultra-thin type memory will be described below.

Figure 18A:
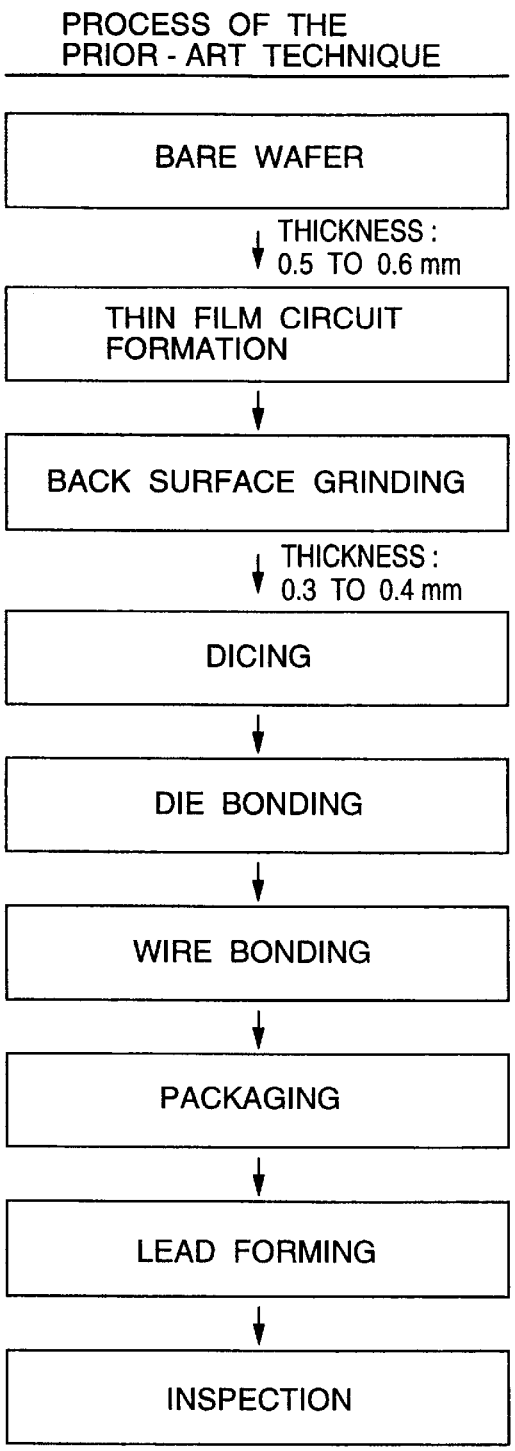
FIGS. 18A and 18B are flow charts for showing a memory manufacturing process according to the prior art technique and the present invention respectively.

At first, a manufacturing process of the prior-art memory will be explained with reference to FIGS. 18A and 18B. According to the prior-art manufacturing process, a LSI circuit is processed by a lithographic technology or the like on the surface of a silicon wafer of 6 inches or 8 inches, as shown in FIG. 18A, to form several dozens of LSI on one silicon wafer. In this case, in order to facilitate the handling and to prevent a crack of a wafer due to a thermal shock generated in heating process, the thickness of the silicon wafer is set to 0.5 to 0.6 mm. However, it is necessary to thin the wafer after processing the LSI circuit in order to improve the heat radiation and to reduce collector resistance of the transistor. For the above purpose, the wafer back surface is grinded (back surface grinding) to have the wafer thickness of 0.3 to 0.4 mm. After this process, the silicon wafer is dices and pelletized into LSI chips. An LSI chip is bonded to the lead frame (die bonding), and an electrode on the chip and the lead frame are connected together by a wire bonding. The LSI chip and the lead frame are molded by a resin (molding resin). Then, the lead frame projected from the package are disconnected and formed (lead forming).

As described above, according to the prior-art manufacturing process of a memory, there is no process of reducing the thickness of the memory LSI chip after the packaging. In order to thin the memory by this process, it is necessary to thin the wafer at the time of grinding the rear surface. It is possible to thin the wafer to around 0.1 mm in the back surface grinding process. However, the handling tends to be difficult when the wafer is thinned. There occurs a problem of a warp in a few mm order, and there also occurs a problem of a wafer crack or the like when a protection tape for protecting the thin-film circuit-formed surface during the processing is removed. Further, in the later processes of dicing, die bonding, wire bonding and packaging, the wafer and the chip after the disconnection are thinned and therefore they are cracked easily. Because of the large scale warping derived from the wafer grinding, dicing and wire bonding can not be performed. From the above aspect, the limit of the thickness of the wafer after the grinding process in the back side grinding is considered to be around 0.2 mm.

Figure 18B:
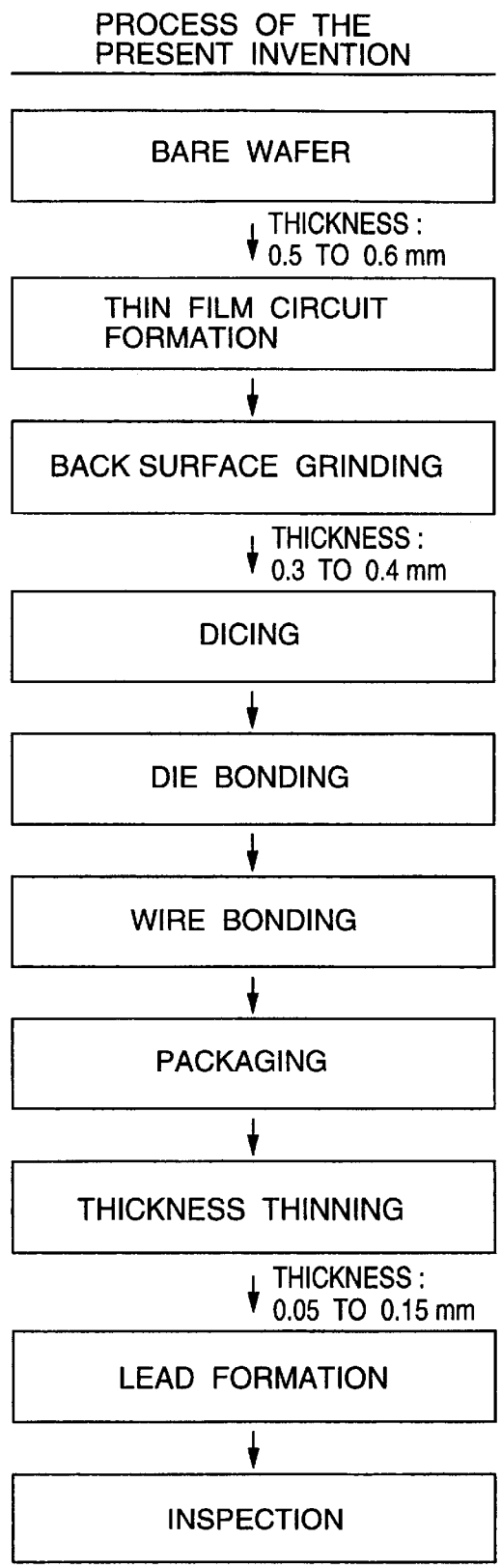

Against the above-described prior-art process, the present invention has the process of grinding the back side of the LSI chip after the packaging to thin the LSI chip, as shown in FIG. 18B. In this case, the thickness of the LSI chip can be set to 0.05 mm or smaller. According to this method, the LSI chip is reinforced by the package resin and the lead frame even if the LSI chip has been thinned, so that the LSI chip after the processing is not easily cracked. Further, in this case, the thickness of the semiconductor package is at least 0.25 mm, and therefore, there occurs no difficulty in the handling and the later processes.

Figure 19:
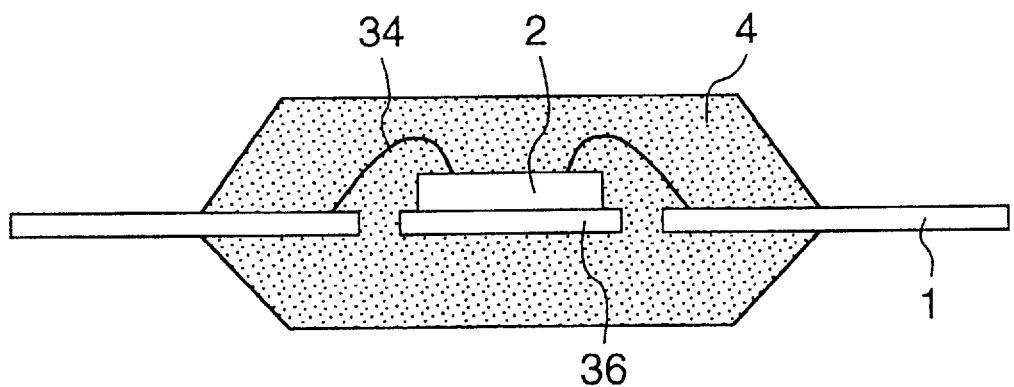
FIG. 19 is a cross section of a COL structure memory.
Figure 20:
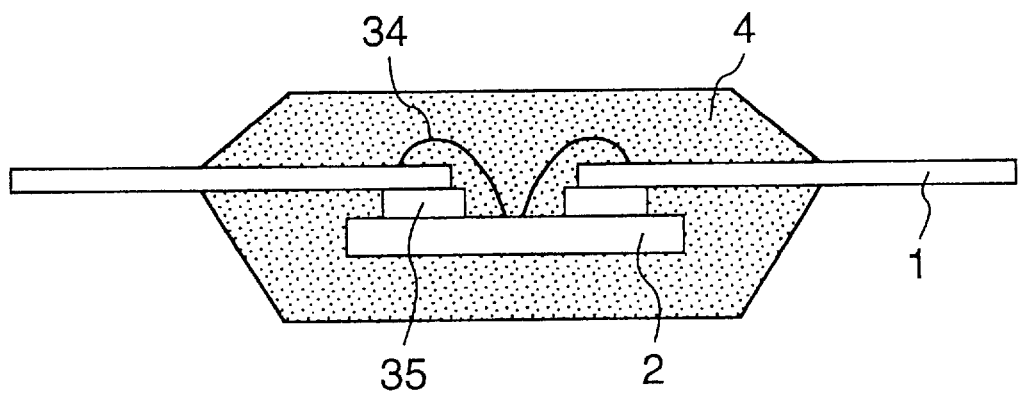
FIG. 20 is a cross section of an LOC structure memory.

The memory package structure to be processed will be explained next. As representative memory package, there are a tab structure as shown in FIG. 19 and an LOC (Lead On Chip) structure as shown in FIG. 20. According to the tab structure, an LSI chip is disposed on the tab and the LSI chip 2 and the lead frame 1 are connected with a wire 34, and all of these are molded by a resin 4. In the case of carrying out a grinding process according to the present invention for the memory of the tab structure 36, the processing can not be started until the LSI chip is exposed to the processing surface because the tab 36 and the lead frame 1 are positioned beneath the LSI chip 2. In this case, it is also possible to process the resin beneath the tab and the lead frame to thin the tab structure. However, when the resin 4 beneath the lead frame is thinned, the lead frame is delaminated at the time of forming the lead, and this is a problem. From the above aspect, it is considered that the present invention has a small effect of thinning the memory package in the tab structure. On the other hand, in the memory package of the LOC structure shown in FIG. 20, the lead frame is fixed on the LSI chip by an adhesive tape 35, and the LSI chip 2 and the lead frame 1 are connected with the wire 34. All of these are molded by resin. When the grinding process according to the present invention is carried out for the memory of this LOC structure, the resin beneath the LSI chip is removed at first. When the grinding is progressed, the back side of the LSI chip (a surface on which the circuit is not formed) is processed so as to reduce the thickness of the LSI chip. As a result, the whole thickness of the packaged memory is also reduced. Thus, the objects of the present invention are achieved.

Figure 16:
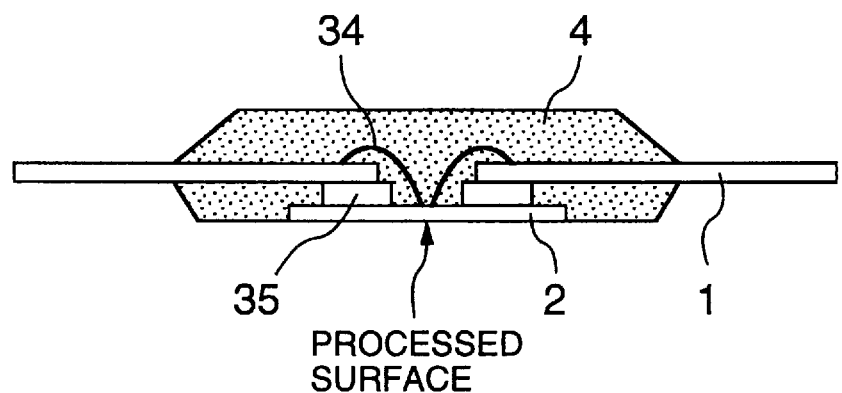
FIG. 16 is a cross section for showing a memory after a thinning.
Figure 17:
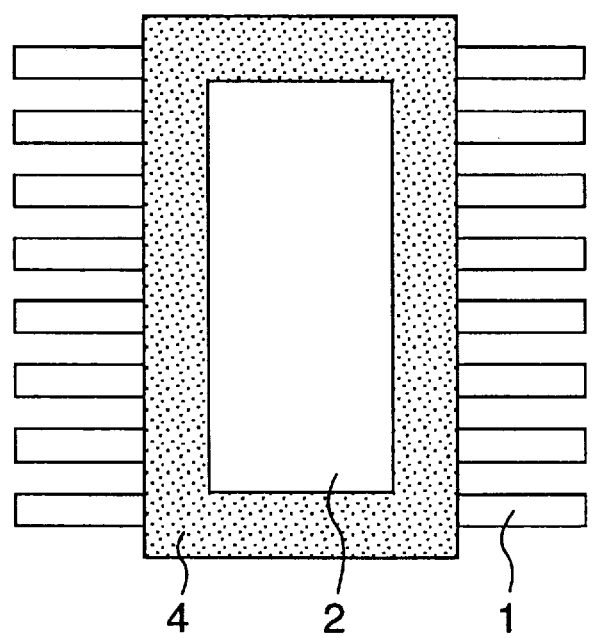
FIG. 17 shows a shape of a processed surface of a memory after a thinning.

FIG. 16 shows a cross section of the memory package after the thinning process, and FIG. 17 shows a structure of the memory processed surface. When the memory package thickness of the LOC structure is reduced, the back surface of the LSI chip is exposed as the processed surface as shown in FIG. 16. This processed surface is shown in FIG. 17. In the case of thinning process the memory of the LOC structure, the back surface of the LSI chip and the mold resin become the process to be processed. When the thinning process is carried out by a machining process, a grinding process and a polishing process, which are representative mechanical processings, for a composite material which consists of a plastic material (resin) and a brittle material (LSI chip), the following problems are envisaged.

1. The LSI chip is cracked by an external force generated at the time of the processing. (an occurrence of a crack)

2. An interface between the LSI chip and the resin is delaminated by a force generated at the time of the processing.

3. The reliability of the LSI chip is reduced because of a coarse finish of the processed surface of the LSI chip.

As a result of considering the above three problem areas, an investigation has been carried out for a grinding process which is suitable for the processing of the composite materials including the ceramic material, with good processing efficiency and with a resultant fine surface finish. Embodiments of the thinning method will be explained below.

EMBODIMENT 4

As a method for grinding, a plane surface grinding method using a cup type grinding wheel was used. The plane surface grinding method using the cup type grinding wheel has a finer surface finish of the processed surface than the surface finish obtained by the plane grinding method using a disk type grinding wheel. Therefore, the plane surface grinding method using the cup type grinding wheel is considered to be suitable for the thinning processing according to the present invention. Further, in the case of the grinding processing method using the cup type grinding wheel, there are an in-feed grinding method and a rotary grinding method. A main known difference between the two grinding method is that a finer surface finish can be obtained by the in-feed grinding method, and particularly, the in-feed grinding method is an advantageous processing method for a large object to be processed, such as, for example, a silicon wafer. For the thinning process of the present invention, either processing method can be used. However, the in-feed grinding system which can obtain a finer surface finish was used in this case.

A schematic diagram of the grinding process is shown in FIGS. 8A to 8B. At the time of the grinding process, several memory packages 28 up to a few dozens of memory packages 28 (four memories in the case of FIG. 8) after packaging are fixed to a work holder 27. In this case, the memory packages are fixed such that the top surfaces of the memory packages face to the surface of the work holder on which the memories are bonded with the work holder. In this case, if the lead frame which is projected from the package is bent after lead forming, the grinding process is interrupted. Therefore, it is necessary that the lead forming of the memory packages are not performed before the grinding process. A cup type diamond grinding wheel 29 was used for the grinding tool.

In the grinding process, the back surfaces of the memory LSI after packaging are brought into contact with the work surface of the cup type diamond grinding wheel 29, and the cup type diamond grinding wheel 29 is moved (cross fed) to an arrow direction in FIG. 8 in the state that the work holder and the grinding wheel are rotated together. Thus, the grinding process is achieved.

Next, an actual example of the grinding process will be explained. For the processing, a TSOP type memory package of the LOC structure shown in FIG. 21 was used. The whole thickness of the memory was 1 mm, which was the total of 0.4 mm for the thickness of the resin on the LSI chip, 0.3 mm for the thickness of the LSI chip 2 and 0.3 mm for the thickness of the resin beneath the LSI chip. An in-feed grinding was carried out for the memories under the following conditions.

a processing machine: a plane surface grinding machine (GHR-SF, a product of Hitachi Seiko Co., Ltd.)

a grinding wheel: a cup type metal bond diamond grinding stone (SDI500P75M)

rotation speed of the grinding wheel: 5,000 rotations/minute rotation speed of working axis: 300 rotations/minute cross feed speed: 50 $\mu$m/minute cross feed volume: 0.3, 0.4, 0.5, 0.55 mm Based on the above conditions, the TSOP memories were processed, and the grinding wheel was cross fed, so that the thickness of the LSI chip was grinded to 0.05 mm. As a result, there occurred no problem of a crack in the LSI chip or delamination of the resin from the interface between the resin and the LSI chip. The surface coarseness of the grinded surface of the LSI chip was 0.08 $\mu$m Rmax, which is a surface finish in the state close to a polished surface. Further, a temperature cycle test (−55° C. to +150° C., 100 cycle) was carried out as a reliability test of the memory packages after the processing, and there was no problem of an occurrence of a crack in the LSI chip or the like.

As described above, when the back surfaces of the memory LSI after packaging was grinded, the back surface (processed surface) of the LSI chip was exposed, as shown in FIG. 17. When a lead forming and an inspection were carried out in this state, there was a risk of damaging the back surface of the exposed LSI chip and cracking the LSI chip. In order to avoid such a risk, a polyimide tape was attached to the processing surface to protect the LSI chip. When a lead forming and an inspection were carried out in this state, no problem occurred.

Figure 21:
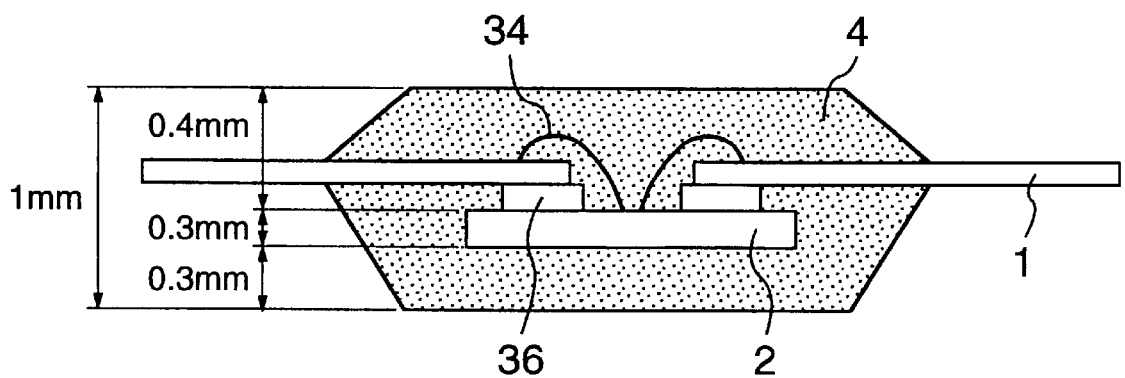
FIG. 21 is a cross section (LOC structure) of a TSOP memory.

From the above result, it was confirmed that when the TSOP memory shown in FIG. 21 was thinned, the total thickness of the memory and the thickness of the LSI chip could be set to 0.45 mm and 0.05 mm respectively, with no problem.

A result of the grinding process of an ultra-thin memory shown in FIG. 22 will be explained next. This memory utilizes a wireless bonding technique according to which the lead frame 1 and the LSI chip 2 were connected with a bump 5 instead of a wire. In order to have a thin thickness of the memory, a lead frame of the thickness of 0.05 mm, thinner than the conventional lead frame, was used and the back surface of the LSI chip was exposed from the resin after the molding. As a result, the total thickness of the memory package was set as 0.45 mm. In order to obtain a further thin memory package, a process for grinding the back surface of the memory was investigated.

In the case of this type of memory package, the cross feed volume and the chip processing volume were almost the same because the back surface of the LSI chip was exposed. Accordingly, it was easy to know the processing volume of the LSI chip. Further, since the back surface of the LSI chip was exposed, the LSI chip would not be molded in an inclined style inside the package. Accordingly, there was no substantial variation in the processing volume of LSI chips. From the above aspect, the memory package with the back surface of the LSI chip exposed from the package as shown in FIG. 22 was considered to be suitable for the grinding process.

The memory was processed in the same conditions as applied to the processing of the TSOP type memory package except the processing volume of 0.2 mm. In the grinding process, the grinding wheel has been cross fed until the package thickness was set to 0.2 mm and the thickness of the LSI chip was set to 0.1 mm. As a result of the grinding process, there occurred no problem of a crack in the LSI chip or a delamination of the resin from the interface between the resin and the LSI chip. Further, the surface coarseness or roughness of the back surface of the LSI chip after the grinding was 0.08 μm Rmax, which was made into a substantially polished surface. Further, after a polyimide tape was attached to the processed surface, a lead forming and an inspection were carried out, with no particular resultant fracture. Since the package thickness after the grinding was as thin as 0.25 mm, there occurred a warp of 0.06 mm due to a stress of the resin on the surface of the LSI chip. This, however, was no particular fracture.

Figure 22:
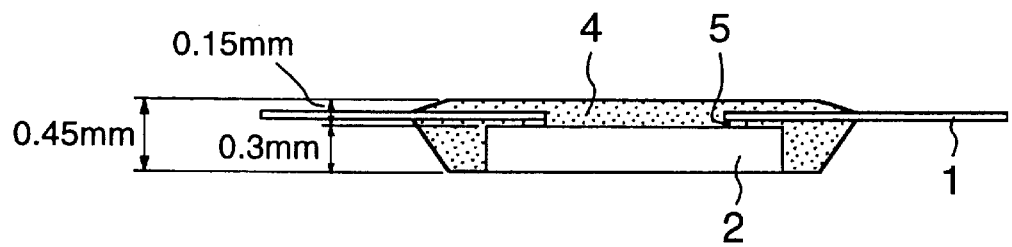
FIG. 22 is a cross section of an ultra-thin memory (before thinning) according to the present invention.

From the above result, it was confirmed that when the ultra-thin package shown in FIG. 22 is thinned, the total thickness of the package and the thickness of the LSI chip could be set to 0.25 mm and 0.1 mm respectively, with no problem.

In the above-described grinding process of the LSI after packaging, the following limitations are considered for the thinning process.

1) limitation of the thinning of the LSI chip

A LSI circuit formed on the surface of the LSI chip has a thickness of about 0.005 mm for the patterned layer and a thickness of about 0.001 mm for the active layer beneath the patterned layer. In the thinning process, this LSI circuit must be left without exception.

Accordingly, as a limit of the thickness of the LSI chip in the thinning process, the total thickness of the patterned layer and the active layer is 0.006 mm. On the other hand, when a minimum thickness of the LSI chip was actually checked after packaging, it has been confirmed that there occurs no problem of a crack in the LSI chip or the like even if the memory is grinded until the thickness of the LSI chip reaches 0.01 mm.

2) limitation of the thinning of the memory In order to prevent the malfunction of the memory, it is necessary to have about 0.1 mm thickness of the resin which covers the surface of the LSI chip. Accordingly, 0.1 mm which is the thickness of the resin plus 0.006 mm which is a marginal limit of the thickness of the LSI chip is a limit to the thinning of the memory. As a result, the limit thickness of the memory after the thinning process is considered to be about 0.1 mm.

EMBODIMENT 5

The thinning process of the memory using the grinding process has been described in the fourth embodiment. In the grinding process, the back surface of the LSI chip can be finished to almost a polished surface, but a slight warp and micro crack occur on the processed surface. In order to eliminate these minor problems, a method for polishing the back surface of the memory after the grinding process has been investigated.

There are mainly two types of polishing method; lapping and polishing. Lapping is a polishing method used for processing a coarse surface of the shape of mainly a plane surface or a cylindrical surface, and polishing is a method used for improving the coarse surface and setting the processed surface free of damage. In this case, polishing has been used to eliminate a warp and a micro crack after the grinding process. Polishing will be explained below.

Figure 15A:
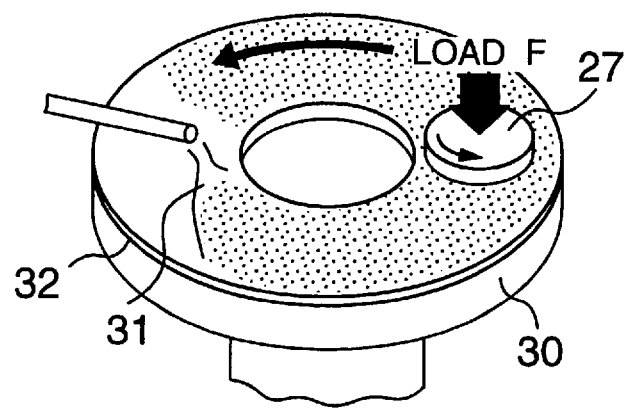
FIGS. 15A and 15B are a schematic view and a cross section respectively for explaining the concept of a polishing which can be used together with the grinding.
Figure 15B:
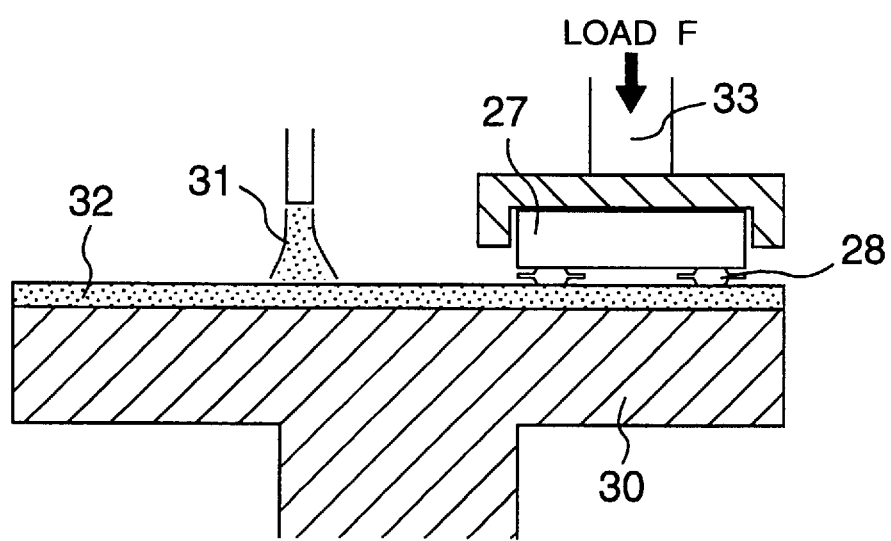

FIGS. 15A and 15B are schematic illustrations for explaining a polishing process. For the polishing process, an abrasive cloth 32 was bonded to a turn table 30, an abrasive solution was flown on to the abrasive cloth, the surface of an object to be processed was pressed against the abrasive cloth, and the turn table 30 was rotated under pressure. By this operation, the surface of the object to be processed and the abrasive cloth 32 were sided against each other with the presence of free abrasive 31 in the abrasive solution, so that the free abrasive 31 finely removed the surface of the processed surface. Thus, the abrasive process was achieved.

In the polishing process, after a memory package was grinded to be thin, the package was fixed to a pressing cylinder 33 in the state that the package was fixed to the work holder, and thus the polishing was performed.

The TSOP type package shown in FIG. 21 and the ultra-thin package shown in FIG. 22 were processed. For the grinding process as a pre-processing, these packages were processed in the same conditions as the conditions used in the fourth embodiment. However, the grinded volume of the former case was 0.5 mm and the grinded volume of the latter case was 0.2 mm, and the thickness of these packages after the grinding was 0.1 mm respectively. Polishing conditions were shown below.

- a processing machine: a single surface polishing machine (SH24, a product of SPEEDFAM Co., Ltd.)
- an abrasive solution: colloidal silica (GLANZOX3900, a product of FUJIMI Co., Ltd.)
- rotation speed of the abrasive machine: 100 rotations/minute
- rotation speed of the working axis: 100 rotations/minute
- abrasive pressure: 20 kPa
- abrasive cloth: nonwoven fabric (suba400, a product of Rodel Nitta)

As a result of carrying out a polishing process under the above conditions, the back surface (processed surface) of the LSI chip became a polished surface in a 10 minute processing. In this case, when the polishing was performed after the grinding processing, there occurred no fracture of a cracking in the LSI chip or a delamination of the resin at the interface between the resin and the LSI chip. The coarseness of the back surface of the LSI chip after the polishing was 0.01 µm Rmax, which was a polished surface. By carrying out the polishing process, it is considered that a warp and a micro crack caused by the grinding processing can be removed.

EMBODIMENT 6

As described above, a warp and a micro crack occur on the processed surface after the grinding process. In the fifth embodiment, the polishing was performed to remove the above warp and crack. In this case, a wet etching condition was investigated to remove the warp and the micro crack generated by the grinding process.

An acid liquid and an alkaline liquid were available as etching solution for a silicon wafer. In this case, an alkaline etching was selected to prevent a corrosion of the lead frame.

The TSOP type package shown in FIG. 21 and the ultra-thin package shown in FIG. 22 was processed. For the grinding process as a pre-process, these packages were processed in the same conditions as the conditions used in the fourth embodiment. However, the grinded volume of the former case was 0.5 mm and the grinded volume of the latter case was 0.2 mm, and the thickness of these packages after the grinding was 0.1 mm respectively. Wet etching conditions were shown below.

an etching solution: potassium hydroxide KOH
an etching time: 2 minutes

As a result of carrying out an etching under the above conditions after the grinding process, the back surface (processed surface) of the LSI chip was etched by 0.02 mm in a two minute etching. The surface coarseness of the back surface of the LSI chip after the etching was 1.5 to 2.3 µm Rmax. However, since a part of the surface was chemically removed by wet etching, it is considered that no warp or micro crack has occurred after the etching. Further, by carrying out the wet etching after the grinding process, there occurred no crack in the LSI chip or a delamination of the resin from the interface between the resin and the LSI chip.

As described above, it is considered that the warp and the micro crack on the back surface of the LSI chip generated by the grinding process can be removed by the wet etching.

The package of the LOC structure has been used for the processing in three embodiments of the fourth, fifth and sixth embodiments. However, the package of the tab structure can also be thinned by processing the resin which covers the back surface of the LSI chip. Further, although only the memory package has been used for the processing, a semiconductor LSI of a logic in which the LSI chip has been packaged can also be thinned in the same manner as the memory.

According to the semiconductor package which uses the construction of the present invention, an extremely thin semiconductor package can be formed in the state that the LSI chip has been reinforced. Further, in the case of the construction which uses a part of the lead frame, in addition to the reinforcing portion, it is also possible to provide a heat radiation path for reinforcement, a positioning base, and a light shielding part, which is suitable for the thinning of the mold resin, for shielding the LSI from harmful light beams such as ultra-violet rays which cause a malfunction of the LSI.

Since the thickness of a single semiconductor package can be extremely reduced, it is possible to have a thin semiconductor structure, which is thinner than a normal semiconductor, even if a plurality of semiconductor packages are connected in a stacked structure. It is also possible to mount a large number of semiconductor packages in an limited space such as a card shaped casing. Thus, it is possible to assemble a functional circuit which has higher functions than the currently available semiconductor packages.

What is claimed is:

1. In a resin molded lead frame semiconductor device including a resin molded structure having a metal lead frame and an LSI chip, the improvement comprising said metal lead frame and an electrode on said LSI chip being metallurgically directly connected with each other, an overall thickness of said lead frame is thin, a part of said lead frame is structured as a reinforcing member for preventing a warp of said LSI chip, an outer periphery of said structure is resin molded, and a resin portion which covers a mirror surface side on which a circuit of said LSI chip is not formed is a grinded surface so that an overall thickness of said semiconductor device is reduced.

2. A resin molded lead frame semiconductor device comprising a structure having a metal lead frame and an electrode on an LSI chip connected with each other, wherein said lead frame of said resin molded semiconductor device has a plurality of leads and a reinforcing member for preventing a warp of said LSI chip of said resin molded semiconductor device, said leads are cut off from said reinforcing member so as not to be electrically connected with each other, and said leads are electrically connected with said electrode on said LSI chin.

3. A resin molded lead frame semiconductor device comprising a structure having a metal lead frame and an electrode on an LSI chip connected with each other, said lead frame of said resin molded semiconductor device has a plurality of leads and a reinforcing member for preventing a warp of said LSI chip of said resin molded semiconductor device, said leads are cut off from said reinforcing member so as not to be electrically connected with each other, said leads are electrically connected with said electrode on said LSI chip, and an outer periphery of the structure is resin molded such that the rear surface of said LSI chip of said resin molded semiconductor device is exposed.

4. A resin molded lead frame semiconductor according to claim 2, wherein a part of said lead frame is set to have a composite function as one as a heat radiation fin and a heat transfer unit for heat generated from said LSI chip, and an outer periphery of structure is resin molded such that said heat radiation portion is exposed.

5. A resin molded lead frame semiconductor device according to claim 2, wherein a part of said lead frame is set to have a composite function as a light shielding portion for shielding said LSI chip from an irradiation of light beams such as ultra-violet rays which cause a malfunction of said LSI chip, and an outer periphery of said structure is resin molded.

6. A resin molded lead frame semiconductor device according to claim 2, wherein said heat radiation member serves as a heat radiation fin to radiate heat from said LSI chip and is mounted so as to be exposed outside of said molded resin.

7. A composite functional semiconductor module having at least two resin molded semiconductor devices according to claim 2 laid out in a stacked structure, wherein electrode of said respective semiconductor devices are electrically connected to form a functional circuit.

8. A composite functional semiconductor module according to claim 7, wherein a semiconductor type display mark is provided to each of said stacked semiconductor devices to identify a belonging of each semiconductor device to each layer.

9. A method of forming a resin molded semiconductor device comprising the steps of:
utilizing a thin film lead frame;
metallurgically connecting an electrode on said lead frame with an electrode on an LSI chips, said electrode on said lead frame being connected with a reinforcing portion of said LSI chip;
plating a predetermined part of said lead frame including said electrode; and
after finishing said plating, separating said electrode from said reinforcing portion of said LSI chip so that said electrode is electrically isolated from other portions of said reinforcing portion of said LSI chip.

10. A stacked semiconductor module using a lead frame, in which in mounting at least two resin molded semiconductor devices in a stacked structure, each resin molded semiconductor device having an upper surface and a lower surface, an electrode to be led from said resin molded semiconductor device is at first linearly drawn from said resin molded semiconductor device to form a first linear portion extending in a first direction away from said resin molded semiconductor device, next said electrode is once bent in a direction away from the device and in an upper surface direction, and then a second linear portion is provided in the same direction as the first linear portion, and thereafter said electrode portion is bent to form a connection portion in a direction away from said resin molded semiconductor device and in a lower surface direction where a substrate or a similar type of semiconductor device is disposed, said resin molded semiconductor devices being connected with each other by each said connection portion.

11. A card type functional module which is assembled by using a stacked semiconductor module according to claim 7 and functional circuit structure parts other than said stacked semiconductor module.

12. A card type memory module which is assembled by mounting a memory LSI on a stacked semiconductor module according to claim 10 and by further using functional circuit structure parts other than said stacked semiconductor module.

13. A card type memory module which is assembled by using a resin molded semiconductor device according to claim 10 and functional circuit structure parts other than said semiconductor device.

14. A resin molded semiconductor device according to claim 2, wherein said metal lead frame and said LSI chip are metallurgically directly connected by at least one bump.

15. A resin molded lead frame semiconductor device according to claim 2, further comprising disrupted portions interrupting electrical connection between said leads and said reinforcing member.

16. In a resin molded lead frame semiconductor device having a metal lead frame and an LSI chip in a molded resin, the improvement comprising a lead of the metal lead frame is electrically connected to an electrode on the LSI chip by a bump so as to provide a semiconductor device of reduced thickness, wherein said metal lead frame has a plurality of leads and a reinforcing member for preventing a warp of said LSI chip, said leads being cut off from said reinforcing member so as not to be electrically connected with each other.

17. In a resin molded lead frame semiconductor device according to claim 16, wherein said leads are disposed on a peripheral area of said LSI chip, said reinforcing member is disposed on a center of said LSI chip via a resin mold portion.

18. In a resin molded lead frame semiconductor device according to claim 17, wherein said leads and said reinforcing member are disposed to be substantially the same length from said LSI chip.

19. A resin molded lead frame semiconductor device according to claim 2, wherein said leads are disposed on a peripheral area of said LSI chip, said reinforcing member is disposed on a center of said LSI chip via a resin mold portion.

20. A resin molded lead frame semiconductor device according to claim 2, wherein said leads and said reinforcing members are disposed to be substantially the same length from said LSI chip.

21. A resin molded lead frame semiconductor device according to claim 3, wherein said leads are disposed on a peripheral area of said LSI chip, said reinforcing member is disposed on a center of said LSI chip via a resin mold portion.

22. A resin molded lead frame semiconductor device according to claim 3, wherein said leads and said reinforcing member are disposed to be substantially the same length from said LSI chip.

23. In a resin molded lead frame semiconductor device according to claim 1, wherein said leads are disposed on a peripheral area of said LSI chip, said reinforcing member is disposed on a center of said LSI chip via a resin mold portion.

24. In a resin molded lead frame semiconductor device according to claim 1, wherein said leads and said reinforcing member are disposed to be substantially the same length from said LSI chip.

25. In a resin molded lead frame semiconductor device according to claim 1, wherein said metal lead frame and said electrode on said LSI chip are metallurgically directly connected to a bump.

26. In a resin molded lead frame semiconductor device having a metal lead frame and an LSI chip in a molded resin, the improvement comprising a lead of the metal lead frame is electrically connected to an electrode on the LSI chip by a bump so as to provide a semiconductor device of reduced thickness, wherein the metal lead frame and the LSI chip are resin molded to a surface of the device on which a circuit of the LSI chip is not formed and the resin adjacent the surface is a processed surface.

* * * * *